United States Patent
Naganuma et al.

(10) Patent No.: US 9,375,921 B2
(45) Date of Patent: Jun. 28, 2016

(54) PIEZOELECTRIC ELEMENT, LIQUID EJECTING HEAD, AND LIQUID EJECTING APPARATUS

(71) Applicant: SEIKO EPSON CORPORATION, Tokyo (JP)

(72) Inventors: Yoichi Naganuma, Matsumoto (JP); Eiju Hirai, Minowa-machi (JP); Motoki Takabe, Shiojiri (JP); Yuma Fukuzawa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/847,945

(22) Filed: Sep. 8, 2015

(65) Prior Publication Data

US 2016/0067968 A1    Mar. 10, 2016

(30) Foreign Application Priority Data

Sep. 8, 2014   (JP) ................................. 2014-181911
Jul. 14, 2015   (JP) ................................. 2015-140145

(51) Int. Cl.
*B41J 2/045*    (2006.01)
*B41J 2/14*    (2006.01)
*H01L 41/053*    (2006.01)

(52) U.S. Cl.
CPC ......... *B41J 2/14201* (2013.01); *H01L 41/0533* (2013.01); *B41J 2/14233* (2013.01); *B41J 2/14274* (2013.01)

(58) Field of Classification Search
CPC ............... B41J 2/14201; B41J 2/14233; B41J 2/14258; B41J 2/14274
See application file for complete search history.

(56) References Cited

U.S. PATENT DOCUMENTS

2013/0194353 A1    8/2013  Hirai et al.
2014/0253641 A1 *  9/2014  Furuya ................. B41J 2/14201
                                                                347/71

FOREIGN PATENT DOCUMENTS

JP         2013-158909 A    8/2013

* cited by examiner

*Primary Examiner* — Geoffrey Mruk
(74) *Attorney, Agent, or Firm* — Workman Nydegger (57) ABSTRACT

A piezoelectric element includes a vibrating plate which is formed of a first region in which a flexural deformation is allowed, and a second region in which the flexural deformation is inhibited. A piezoelectric element main body includes a lower electrode layer, a piezoelectric layer, and a higher electrode layer on the first region of the vibrating plate. A common metal layer is stacked on the higher electrode layer. A part of the piezoelectric element main body is extended to the second region, and an end portion of the piezoelectric layer is extended to the outside of an end portion of the higher electrode layer on the same side.

3 Claims, 5 Drawing Sheets

PIEZOELECTRIC ELEMENT, LIQUID EJECTING HEAD, AND LIQUID EJECTING APPARATUS

CROSS-REFERENCE TO RELATED APPLICATIONS

The present application claims priority to Japanese Patent Application No. 2014-181911, filed on Sep. 8, 2014 and Japanese Patent Application No. 2015-140145, filed on Jul. 14, 2015, which applications are hereby incorporated by reference in their entirety.

BACKGROUND

The present invention relates to a piezoelectric element including a piezoelectric layer which is interposed between electrode layers which form a pair, a liquid ejecting head which includes the piezoelectric layer, and a liquid ejecting apparatus.

A liquid ejecting apparatus is an apparatus which includes a liquid ejecting head, and ejects various types of liquid from the liquid ejecting head. As the liquid ejecting apparatus, for example, there is an image recording apparatus such as an ink jet printer, and an ink jet plotter; however, these days, the liquid ejecting head is also used in various manufacturing devices by taking advantage that it is possible to make a very small quantity of liquid land on a predetermined position accurately. For example, the liquid ejecting head is used in a display manufacturing device which manufactures a color filter of a liquid crystal display, or the like, an electrode forming device which forms an electrode of an organic electro luminescence (EL) display, a surface light emission display (FED), or the like, and a chip manufacturing device which manufactures a biochip (biochemical element). In addition, a recording head for an image recording device ejects liquid ink, and a coloring material ejecting head for a display manufacturing device ejects a solution of various colors of R (red), G (green), and B (blue). In addition, an electrode material ejecting head for an electrode forming device ejects a liquid electrode material, and a bio-organic material ejecting head for a chip manufacturing device ejects a solution of a bio-organic material.

The above described liquid ejecting head includes a piezoelectric element which causes a pressure change to liquid in a pressure chamber. The piezoelectric element is configured by stacking, for example, a lower electrode layer which functions as an individual electrode which is provided in each pressure chamber, a piezoelectric layer such as lead zirconate titanate (PZT), and a higher electrode layer which functions as a common electrode which is common to a plurality of the pressure chambers, respectively, in order from a side which is close to the pressure chamber, using a film formation technology. In addition, a portion of the piezoelectric layer which is interposed between the higher and lower electrode layers becomes an active unit which is deformed due to an application of a voltage to both the electrode layers. Here, when the piezoelectric layer is deformed, there is a concern that a stress may be concentrated at a border portion between the active unit and a portion which is not the active unit (non-active unit), and a crevice (crack), or the like, may occur in the piezoelectric layer which configures the piezoelectric element. For this reason, a technology in which a rigidity of the border position of the piezoelectric element is increased by extending the piezoelectric layer and the higher electrode layer to the outside of the pressure chamber in the longitudinal direction is disclosed (for example, refer to JP-A-2013-158909).

However, there is a concern that it may not be possible to sufficiently suppress a problem of the occurrence of a cracking, or the like, in the piezoelectric layer, even when the above described configuration is adopted.

SUMMARY

An advantage of some aspects of the invention is to provide a piezoelectric layer, a liquid ejecting head, and a liquid ejecting apparatus which can further reliably suppress an occurrence of a cracking, or the like, in a piezoelectric layer.

According to an aspect of the invention, there is provided a piezoelectric element which includes a support body which is formed of a first region in which flexural deformation is allowed, and a second region which is an outside of the first region, and in which flexural deformation is inhibited; a piezoelectric element main body which is formed by staking a first electrode layer, a piezoelectric layer, and a second electrode layer on the first region of the support body in this order; and a metal layer which is stacked on the second electrode layer through an adhesion layer, in which a part of the piezoelectric element main body is extended to the second region, and an end portion of the piezoelectric layer is extended to an outside of an end portion of the second electrode layer in a region on the extended side, the metal layer and the adhesion layer are extended to the second region beyond the end portion of the second electrode layer from a position of being overlapped with the first region in the region on the extended side, and a protective film with an insulation properties is formed between the adhesion layer and the piezoelectric layer in a region which is separated from the second electrode layer.

According to another aspect of the invention, there is provided a liquid ejecting head including the piezoelectric layer with the configuration described above. According to still another aspect of the invention, there is provided a liquid ejecting apparatus including the liquid ejecting head with the configuration described above.

According to the aspects of the invention, since a metal layer regulates a motion of a piezoelectric element main body at a border between the first region and the second region, it is possible to prevent a piezoelectric element main body from being excessively deformed. In this manner, it is possible to weaken the stress which occurs at a border position between an active unit and a non-active unit. In addition, since the piezoelectric layer is extended to the second region, and a protective layer is formed between the adhesion layer and the piezoelectric layer in a region separated from the second electrode layer, it is possible to suppress a deformation of the piezoelectric layer in the portion, and to prevent stress from being concentrated on the border position between the active unit and the non-active unit. In this manner, it is possible to further reliably suppress a problem of an occurrence of a cracking, or the like, in the piezoelectric layer when the piezoelectric layer main body is deformed. As a result, it is possible to improve the reliability of the piezoelectric layer, and to improve the reliability of the liquid ejecting head and the liquid ejecting apparatus.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment for executing the invention will be described with reference to accompanying drawings. In the embodiment which will be described below, various limitations are made as a preferable and specific example of the invention; however, the scope of the invention is not limited to these embodiments as long as there is no particular description for limiting the invention in the following descriptions. In the following descriptions, a case in which the piezoelectric element according to of the invention is used as an actuator for ejecting ink in an ink jet printer (hereinafter, referred to as printer) which is a type of a liquid ejecting apparatus on which an ink jet recording head as a type of a liquid ejecting head (hereinafter, referred to as recording head) is mounted will be exemplified.

Figure 1:
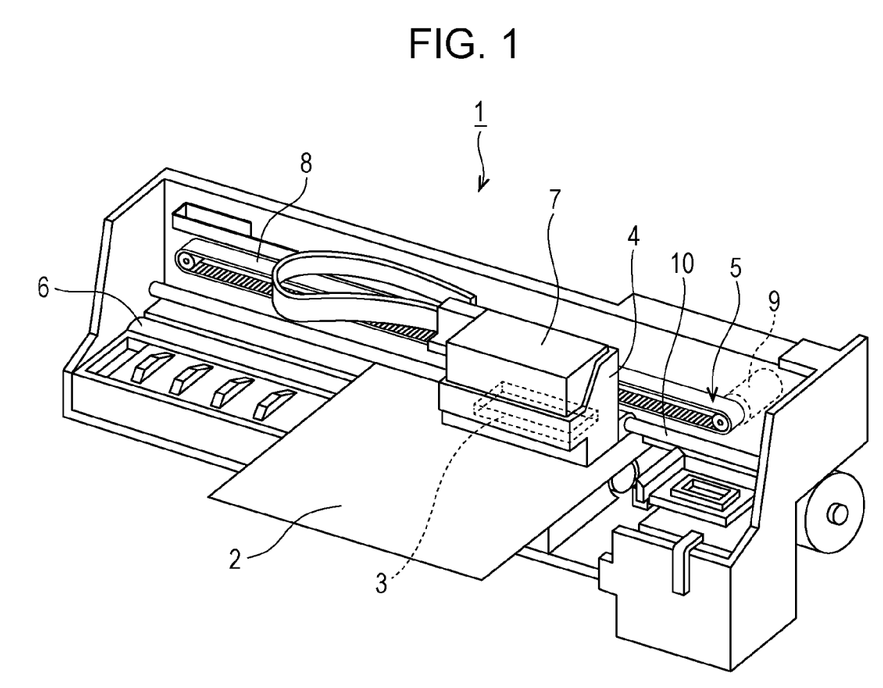
FIG. 1 is a perspective view which describes a configuration of a printer.

A configuration of a printer 1 will be described with reference to FIG. 1. The printer 1 is an apparatus which performs recording of an image, or the like, by ejecting liquid ink onto the surface of a recording medium 2 (a type of landing target) such as a recording sheet. The printer 1 includes a recording head 3, a carriage 4 to which the recording head 3 is attached, a carriage moving mechanism 5 which moves the carriage 4 in the main scanning direction, and the like. In addition, the printer 1 includes, for example, a platen roller 6 as a mechanism for moving the recording medium 2 in the sub-scanning direction. As the movement mechanism, a drum, or the like, may be used in addition to the platen roller 6. Here, the ink as a type of liquid is stored in an ink cartridge 7 as a liquid supply source. The ink cartridge 7 is detachably mounted on the recording head 3. In addition, it is also possible to adopt a configuration in which the ink cartridge is arranged on the main body side of the printer, and ink is supplied to the recording head through an ink supply tube from the ink cartridge.

The carriage moving mechanism 5 includes a timing belt 8. In addition, the timing belt 8 is driven by a pulse motor 9 such as a DC motor. Accordingly, when a pulse motor 9 is operated, the carriage 4 is guided to a guide rod 10 which is stretched in the printer 1, and performs a reciprocating movement in the main scanning direction (width direction of recording medium 2).

Figure 2:
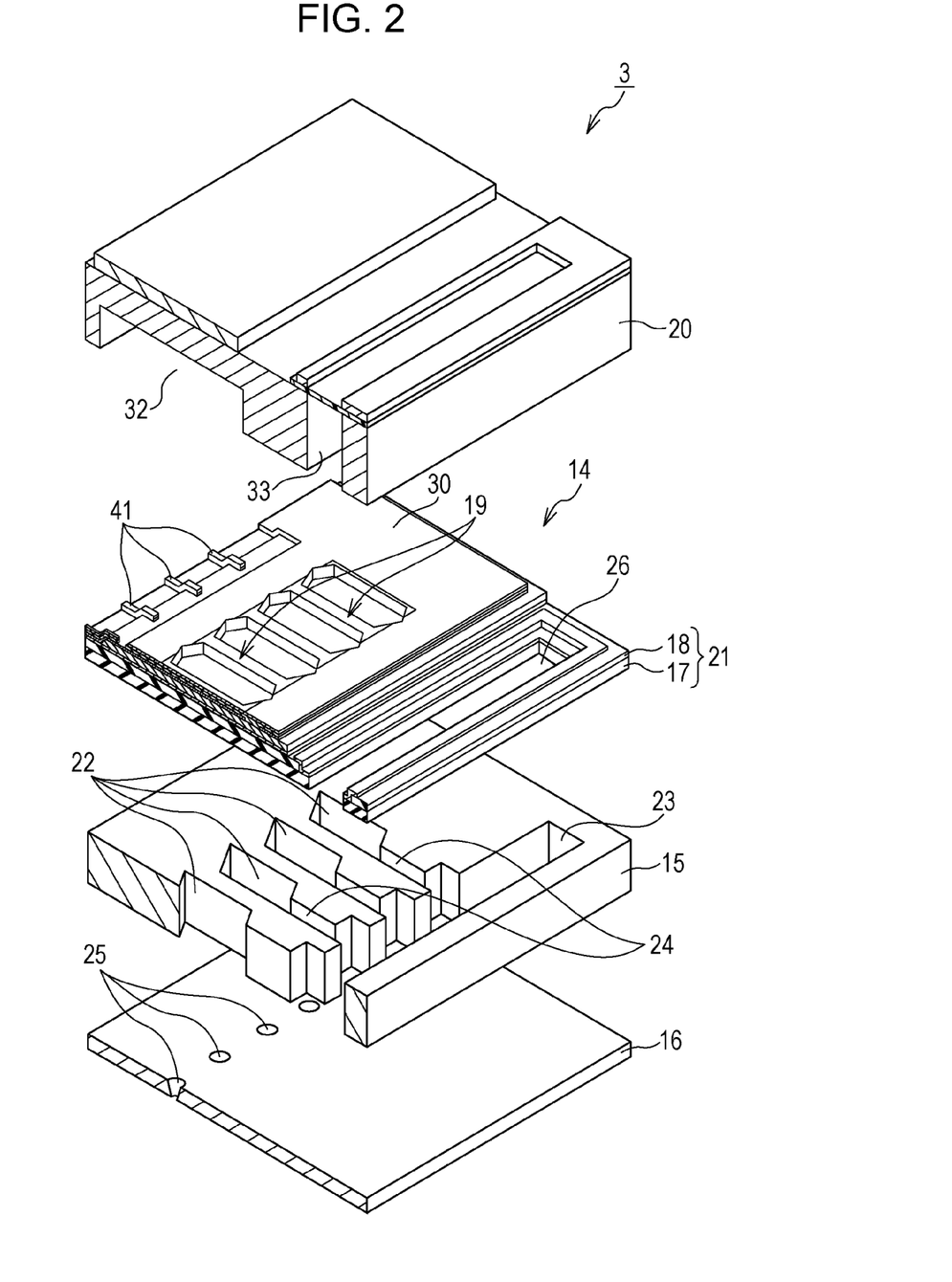
FIG. 2 is an exploded perspective view of a recording head.
Figure 3:
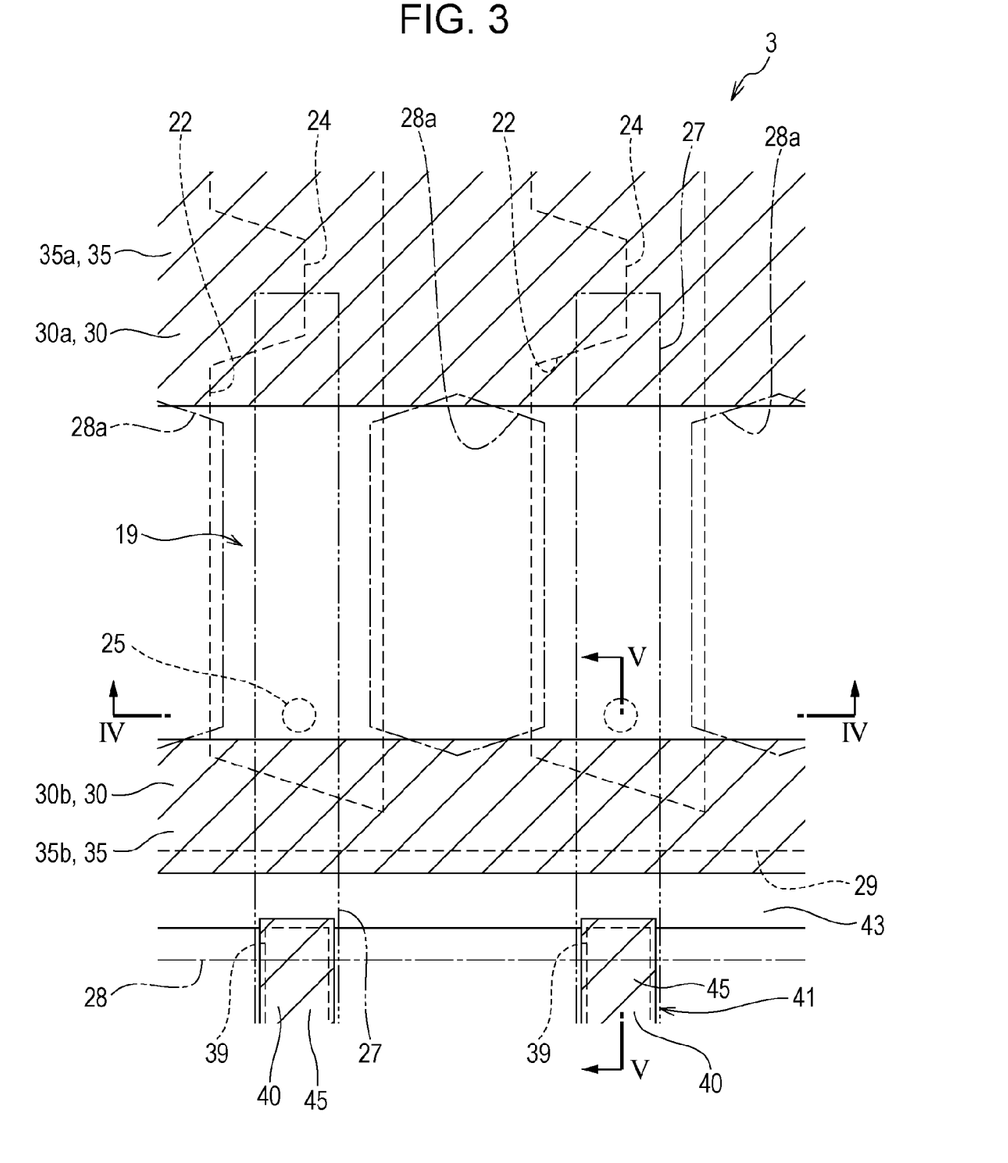
FIG. 3 is a plan view of main portions of the recording head.
Figure 4:
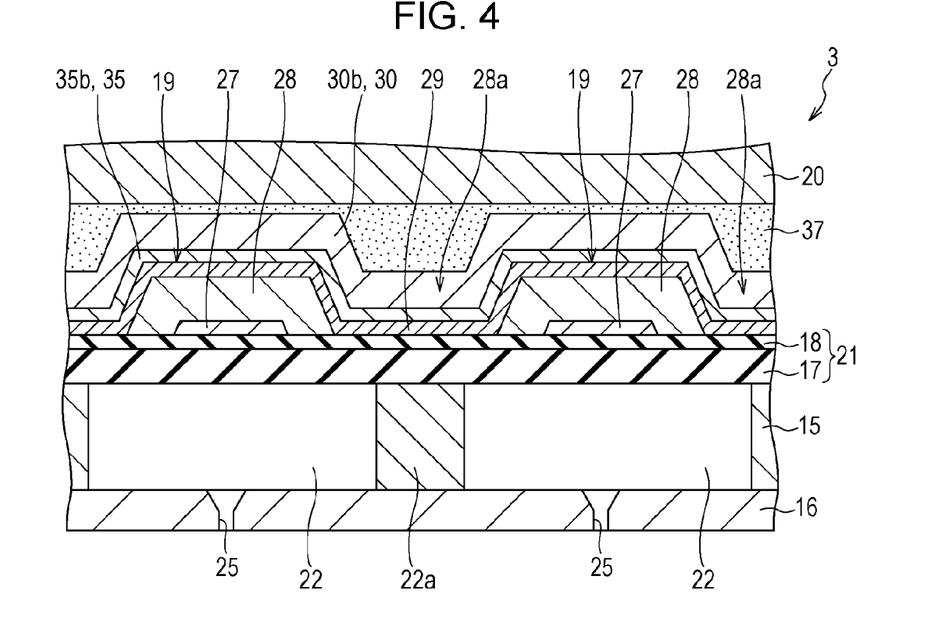
FIG. 4 is a sectional view which is taken along line IV-IV in FIG. 3.
Figure 5:
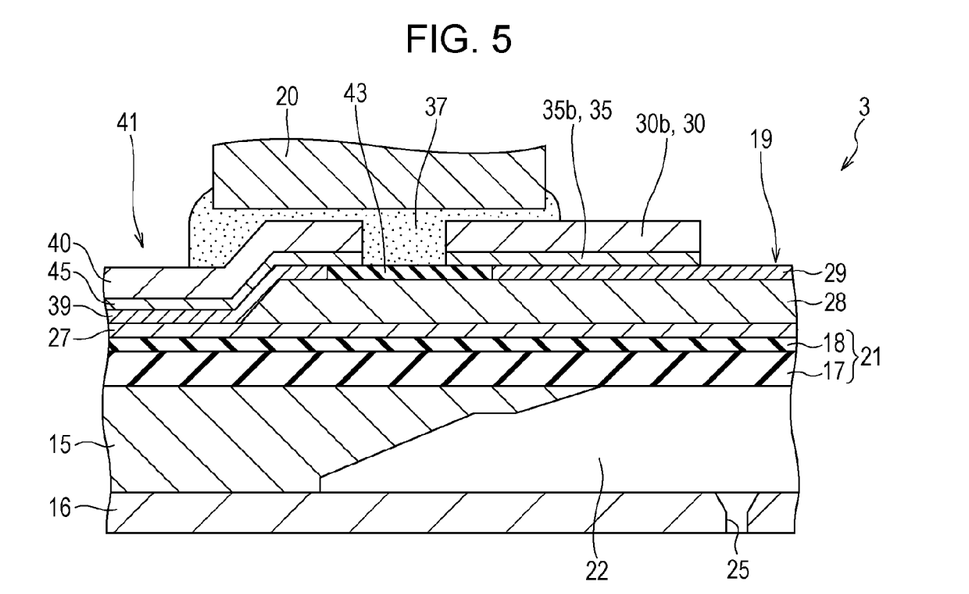
FIG. 5 is a sectional view which is taken along line V-V in FIG. 3.

FIGS. 2 to 5 are schematic views which illustrate a configuration of the recording head 3 according to the embodiment. Particularly, FIG. 2 is an exploded perspective view of the recording head 3, and FIG. 3 is a plan view (top view) in a main portion of the recording head 3. In addition, FIG. 4 is a sectional view which is taken along line IV-IV in FIG. 3, and FIG. 5 is a sectional view which is taken along line V-V in FIG. 3. In addition, FIG. 3 illustrates a state in which a sealing plate 20 which will be described later is not bonded. That is, FIG. 3 is a plan view of a vibrating plate 21 in which each layer is stacked. In FIG. 3, hatching portions denote a metal layer (common metal layer 30 and individual metal layer 40).

The recording head 3 according to the embodiment is configured by stacking a pressure chamber forming substrate 15, a nozzle plate 16, an actuator unit 14, and the sealing plate 20. The pressure chamber forming substrate 15 is a plate member which is formed of a silicon single crystal substrate, or the like. As illustrated in FIG. 4, spaces which form a plurality of pressure chambers 22 (hereinafter, appropriately referred to as pressure chamber space) are aligned by interposing a partitioning wall 22a therebetween in the pressure chamber forming substrate 15. These pressure chamber spaces are hollow portions which are long in a direction orthogonal to a nozzle column direction, and are provided in one-to-one correspondence to each nozzle 25 of a nozzle plate 16. That is, each pressure chamber space (or pressure chamber 22) is formed at the same pitch as a formation pitch of the nozzle 25 along the nozzle column direction. In addition, the pressure chamber forming substrate 15 according to the embodiment is created by performing anisotropic etching with respect to a silicon single crystal substrate with a plane orientation of (110). For this reason, as illustrated in FIG. 3, a higher opening of the pressure chamber space (opening on a side opposite to nozzle 25 side) forms a trapezoidal shape. In addition, as illustrated in FIG. 5, an inner wall of the pressure chamber 22 in the longitudinal direction forms a slope in which a part thereof is obliquely inclined. In addition, a step is formed in the middle of the slope.

As illustrated in FIG. 2, in the pressure chamber forming substrate 15, a communication unit 23 which penetrates the pressure chamber forming substrate 15 is formed along an aligning direction of the pressure chamber space, in a region which is located at the side of the pressure chamber space in the longitudinal direction with respect to the pressure chamber space (side opposite to communication side of nozzle 25). The communication unit 23 is a hollow portion which is common to each pressure chamber space. The communication unit 23 and each pressure chamber space respectively communicate through an ink supply path 24. In addition, the communication unit 23 communicates with a communication opening portion 26 of a vibrating plate 21 a liquid chamber hollow portion 33 of the sealing plate 20, which are described later, and configures a reservoir (common liquid chamber) which is an ink chamber common to each pressure chamber space (pressure chamber 22). The ink supply path 24 is formed with a width smaller than that of the pressure chamber 22, and is a portion which becomes a flow path resistance with respect to ink which flows into the pressure chamber 22 from the communication unit 23.

The nozzle plate 16 is bonded to a lower face of the pressure chamber forming substrate 15 (face opposite to bonding face to actuator unit 14) using an adhesive, a heat welding film, or the like. In the nozzle plate 16 according to the embodiment, each nozzle 25 is aligned at a pitch (distance between centers of adjacent nozzles 25) corresponding to dot forming density (for example, 300 dpi). As illustrated in FIG. 3, each nozzle 25 communicates with the pressure chamber space at an end portion on a side opposite to the ink supply path 24. In addition, the nozzle plate 16 is formed of, for example, glass ceramic, a silicon single crystal substrate, stainless steel, or the like.

The actuator unit 14 is configured of the vibrating plate 21, a piezoelectric element main body 19, and the common metal layer 30, the lead electrode unit 41, and the like, which are stacked on the vibrating plate 21, as illustrated in FIG. 2. The vibrating plate 21 (corresponding to support body in the invention) is configured of an elastic film 17 which is formed on a top face of the pressure chamber forming substrate 15, and an insulating film 18 which is formed on the elastic film 17. As the elastic film 17, for example, silicon dioxide ($SiO_2$) with a thickness of 300 nm to 2000 nm is preferably used. As the insulating film 18, for example, zirconium oxide (ZrOx) with a thickness of 30 nm to 600 nm is preferably used. A portion of the vibrating plate 21 corresponding to the pressure chamber space, that is, a portion which partitions a part of the pressure chamber 22 by closing a higher opening of the pressure chamber space is a region in which flexural deformation in a direction away from the nozzle 25 or a direction towards the nozzle 25 is allowed along with flexural deformation of the piezoelectric element main body 19, and the region corresponds to a first region of the invention. On the other hand, the outside of the region, that is, a region in the outside of the pressure chamber space is a region in which flexural deformation of the piezoelectric element main body 19 is inhibited, and the region corresponds to a second region in the embodiment of the invention. In addition, as illustrated in FIG. 2, a communication opening portion 26 which communicates to the communication unit 23 of the pressure chamber forming substrate 15 is open at a portion corresponding to the communication unit 23 of the pressure chamber forming substrate 15 in the vibrating plate 21.

The piezoelectric element main body 19 is formed at a portion corresponding to the pressure chamber 22 of the vibrating plate 21 (insulating film 18), that is, a top face of the first region (face on the side opposite to nozzle 25 side). As illustrated in FIGS. 4 and 5, the piezoelectric element main body 19 according to the embodiment is configured by stacking a lower electrode layer 27 (corresponding to first electrode layer in embodiment of the invention), a piezoelectric layer 28, and a higher electrode layer 29 (corresponding to second electrode layer in embodiment of the invention) in order from the vibrating plate 21 side using a film formation technology. That is, the piezoelectric element main body 19 is a portion at which the piezoelectric layer 28 is interposed between the lower electrode layer 27 and the higher electrode layer 29, and is a portion which becomes an active unit in which piezoelectric strain occurs due to an application of a voltage to both the electrode layers. In addition, as illustrated in FIG. 5, an end portion on one side of the piezoelectric element main body 19 according to the embodiment in the longitudinal direction (side opposite to ink supply path 24) is extended to the region in the outside of the pressure chamber space in the longitudinal direction (second region). In addition, the common metal layer 30 is stacked on the higher electrode layer 29 in the border region between the inside and outside of the pressure chamber 22 (specifically, higher opening of pressure chamber space) in the longitudinal direction through a common adhesion layer 35. In addition, details of a positional relationship between each of layers which is stacked on the vibrating plate 21 will be described later. In addition, a portion which is formed of the vibrating plate 21, the lower electrode layer 27, the piezoelectric layer 28, the higher electrode layer 29, the common adhesion layer 35, the common metal layer 30, and a protective film 43 which will be described later, and functions as an actuator by including the outside of a portion corresponding to the pressure chamber 22 corresponds to the piezoelectric element of the invention.

As the higher electrode layer 29 and the lower electrode layer 27, various metal such as iridium (Ir), platinum (Pt), titanium (Ti), tungsten (W), tantalum (Ta), molybdenum (Mo), an alloy of these, or the like, is used. As an example of an alloy electrode, there is $LaNiO_3$, or the like. In addition, as the piezoelectric layer 28, a ferroelectric piezoelectric material such as lead zirconate titanate (PZT), relaxor ferroelectrics which is obtained by adding metal such as niobium, nickel, magnesium, bismuth, or iridium to the ferroelectric piezoelectric material, or the like, is used. In addition to that, it is also possible to use a non-lead material such as barium titanate. In addition, for the thickness of each layer, it is preferable to set the thickness of the higher electrode layer 29 to 15 nm to 100 nm, the thickness of the piezoelectric layer 28 to 0.7 µm to 5 µm, and the thickness of the lower electrode layer 27 to 50 nm to 300 nm, for example. In addition, for the common metal layer 30, gold (Au), or the like, is used, and for the common adhesion layer 35, titanium, nickel, chrome, and an alloy of these, or the like, is used.

As illustrated in FIG. 2, the sealing plate 20 is bonded to a top face of the actuator unit 14 which is a side opposite to a lower face as a bonding face to the pressure chamber forming substrate 15 through an adhesive 37 (refer to FIGS. 4 and 5). An accommodating hollow portion 32 which can accommodate the piezoelectric element main body 19 is formed in the inside of the sealing plate 20. In addition, a liquid chamber hollow portion 33 is provided at a position of the sealing plate 20 which is the outside in a direction orthogonal to the nozzle column compared to the accommodating hollow portion 32 of the sealing plate 20, and a region corresponding to the communication opening portion 26 of the vibrating plate 21 and the communication unit 23 of the pressure chamber forming substrate 15. The liquid chamber hollow portion 33 is provided along the aligning direction of the pressure chamber space (pressure chamber 22) by penetrating the sealing plate 20 in the thickness direction, and forms a reservoir which becomes a common ink chamber of each pressure chamber space by communicating with the communication opening portion 26 and the communication unit 23 in series, as described above. In addition, though it is not illustrated, in the sealing plate 20, a wiring opening portion which penetrates the sealing plate 20 in the thickness direction is provided at a position corresponding to a terminal region of the actuator unit 14, in addition to the accommodating hollow portion 32 and the liquid chamber hollow portion 33. The individual metal layer 40 in a terminal region which will be described later, and the common metal layer 30 are exposed into the wiring opening portion. In addition, a terminal of a wiring member which is not illustrated from the printer main body side is electrically connected to exposed portions of these metal layers 30 and 40.

In the recording head 3 with such a configuration, ink is taken in from the ink cartridge 7, and a flow path from the reservoir to the nozzle 25 in which the ink supply path 24 and the pressure chamber 22 are included is filled with ink. In addition, when an electric field corresponding to a difference in potential of both electrodes is applied between the lower electrode layer 27 and the higher electrode layer 29 corresponding to pressure chamber 22 respectively, due to a supply of a driving signal from the printer main body side, the piezoelectric element main body 19 is subjected to flexural deformation. Along with this, a region (first region) corresponding to the pressure chamber 22 of the vibrating plate 21 (higher opening of pressure chamber space) is displaced, and a pressure change occurs in the pressure chamber 22. Ink is discharged from the nozzle 25 by controlling the pressure change.

Subsequently, a positional relationship in each layer which is stacked on the vibrating plate 21 will be described in detail. As illustrated in FIG. 4, the lower electrode layer 27 according to the embodiment is independently provided in individual pressure chamber 22. On the other hand, the higher electrode layer 29 according to the embodiment is continuously provided over the plurality of pressure chambers 22. Accordingly, the lower electrode layer 27 becomes an individual electrode in each pressure chamber 22, and the higher electrode layer 29 becomes a common electrode which is common to each pressure chamber 22.

Specifically, the width of the lower electrode layer 27 in a direction in which the pressure chambers are aligned (nozzle column direction) is formed so as to be smaller than the width of the pressure chamber 22 (in detail, higher opening of pressure chamber space), and the width of the piezoelectric layer 28 in a region corresponding to the pressure chamber 22 (first region). In addition, as illustrated in FIG. 3, an end portion on one side (lower side in FIG. 3) of the lower electrode layer 27 is extended to the lead electrode unit 41 (which will be described later), and an end portion on the other side (higher side in FIG. 3) is extended to a position which is overlapped with the ink supply path 24 (in detail, position overlapped with each layer in the stacking direction) beyond the end portion of the pressure chamber 22 (in detail, edge of higher opening of pressure chamber space) in the longitudinal direction (direction orthogonal to nozzle column direction) of the pressure chamber 22. On the other hand, as illustrated in FIG. 4, both end portions of the higher electrode layer 29 are extended to the outside of a group of the pressure chambers 22 which is aligned, in the aligning direction of the pressure chamber. In addition, as illustrated in FIG. 3, in the longitudinal direction of the pressure chamber 22, an end portion on one side of the higher electrode layer 29 is extended to a region between the pressure chamber 22 and the lead electrode unit 41 beyond the end portion of the pressure chamber 22 (in detail, edge of higher opening of pressure chamber space), and an end portion on the other side is extended to the outside of a position which overlaps with the ink supply path 24 beyond the end portion of the lower electrode layer 27.

As illustrated in FIGS. 3 and 5, in the longitudinal direction of the pressure chamber 22, an end portion on one side of the piezoelectric layer 28 is extended to a position which overlaps with an end portion of the lead electrode unit 41 beyond the end portion on one side of the higher electrode layer 29, and an end portion on the other side is extended to the outside of a position which overlaps with the ink supply path 24 beyond the end portion of the lower electrode layer 27. In addition, as illustrated in FIG. 3, the piezoelectric layer 28 is formed over the plurality of pressure chambers 22 in the aligning direction of the pressure chamber, and a plurality of opening portions 28a are formed in a region corresponding to a region between adjacent pressure chambers 22. The opening portion 28a is formed when the piezoelectric layer 28 is removed using etching. That is, the plurality of opening portions 28a are formed at the same pitch as the formation pitch of the pressure chamber 22 (formation pitch of nozzle 25) along the nozzle column direction. In this manner, the piezoelectric element main body 19 which corresponds to one pressure chamber 22 is formed at the same pitch as the formation pitch of the pressure chamber 22 between the opening portions 28a.

As illustrated in FIG. 4, the width of the piezoelectric layer 28 in the nozzle column direction (distance between adjacent opening portions 28a) on the pressure chamber space is formed so as to be smaller than the width of the pressure chamber 22 in the same direction, and larger than the width of the lower electrode layer 27 in the same direction. In addition, as illustrated in FIG. 3, the length of the opening portion 28a in the longitudinal direction is formed so as to be smaller than the length of the pressure chamber 22 (in detail, higher opening of pressure chamber space) in the longitudinal direction. That is, in the longitudinal direction, both end portions on both sides of the opening portion 28a are located at positions corresponding to the inside (center side of pressure chamber 22) further than both end portions of the pressure chamber 22.

In addition, the opening portion 28a according to the embodiment is formed in a hexagonal shape which is long along the longitudinal direction of the pressure chamber 22 in a planar view. In addition, in the longitudinal direction of the pressure chamber 22, the piezoelectric layer 28 in a region which is separated from the opening portion 28a is continuously formed over the plurality of pressure chambers 22.

The common metal layer 30 (corresponding to metal layer of the invention) which is continuous over the plurality of pressure chambers 22 is stacked in a region of an end portion of the piezoelectric element main body 19 in the longitudinal direction of the pressure chamber 22. The common metal layer 30 is stacked on the higher electrode layer 29 through the common adhesion layer 35 (corresponding to adhesion layer of the invention). That is, the common metal layer 30 is stacked on the common adhesion layer 35. The common metal layer 30 and the common adhesion layer 35 according to the embodiment are continuously formed over the plurality of pressure chambers 22, as illustrated in FIG. 3, and are formed on both sides of the opening portion 28a by interposing the opening portion therebetween in a direction orthogonal to the nozzle column direction. The common metal layer 30 and the common adhesion layer 35 which are formed on the both sides are formed from a position which partially overlaps with a region corresponding to the pressure chamber space (first region of vibrating plate 21) to a position which partially overlaps with a region (second region of vibrating plate 21) in the outside of the pressure chamber space in the longitudinal direction, respectively.

Specifically, as illustrated in FIG. 3, the common metal layer 30a and the common adhesion layer 35a which are formed on the other side (ink supply path 24 side, and higher side in FIG. 3) are extended from a region corresponding to an end portion on the other side of the opening portion 28a to a region beyond the pressure chamber 22 and the ink supply path 24, in the longitudinal direction of the pressure chamber 22 (extending direction of piezoelectric element main body 19). According to the embodiment, a common metal layer 30a and a common adhesion layer 35a on the other side are overlapped with an end portion including an apex on the other side of the hexagonal opening portion 28a in a planar view, and are overlapped with an end portion including a border with the ink supply path 24 of the pressure chamber 22.

On the other hand, a common metal layer 30b and a common adhesion layer 35b which are formed on one side (nozzle 25 side, and lower side in FIG. 3) are extended from a region corresponding to an end portion on one side of the opening portion 28a to the end portion of the pressure chamber 22 (in detail, edge of higher opening of pressure chamber space), and a region between the pressure chamber 22 and the lead electrode unit 41 beyond the end portion on one side of the higher electrode layer 29 in the longitudinal direction of the pressure chamber 22. That is, on the piezoelectric layer 28, the common metal layer 30b and the common adhesion layer 35b are extended to the outside (lead electrode unit 41 side) further than the end portion on one side of the higher electrode layer 29. According to the embodiment, as illustrated in FIG. 3, the common metal layer 30b and the common adhesion layer 35b on one side overlap with the end portion including an apex on one side of the opening portion 28a in a planar view, and overlap with the end portion on one side of the pressure chamber 22.

At the end portion on one side of the piezoelectric layer 28, a portion which overlaps with the common metal layer 30b and the common adhesion layer 35b is a portion which deforms when a voltage is applied to the common metal layer 30b through the higher electrode layer 29, and a position corresponding to the end portion on one side of the common metal layer 30b and the common adhesion layer 35b corresponds to a border position between the active unit and the non-active unit. In addition, positions at the end portion in the common metal layer 30 and the common adhesion layer 35 on both sides of the pressure chamber 22 in the longitudinal direction are aligned at the same position, respectively. In addition, the common metal layer 30 and the common adhesion layer 35 on the both sides are extended to a terminal region (not illustrated) on the lead electrode unit 41 side on the outside in a direction in which the pressure chamber is aligned. In the terminal region, the layers are electrically connected to a common electrode terminal of a wiring member.

As illustrated in FIGS. 3 and 5, the protective film 43 with an insulation properties is formed between the common adhesion layer 35b and the piezoelectric layer 28 in a region separated from the end portion on one side of the higher electrode layer 29. That is, the common metal layer 30b and the common adhesion layer 35b which are located at the outside compared to the end portion of the higher electrode layer 29 are stacked on the protective film 43 which is stacked on the piezoelectric layer 28. The protective film 43 according to the embodiment is formed between the end portion on one side of the higher electrode layer 29 and an end portion on the other side of the individual higher electrode layer 39 of the lead electrode unit 41. That is, a region to which the protective film 43 is exposed is formed in a region between the common metal layer 30b and the lead electrode unit 41. In addition, according to the embodiment, as illustrated in FIG. 5, the protective film 43, the higher electrode layer 29, and the individual higher electrode layer 39 are formed so as not to overlap with each other in the stacking direction of each layer; however, a part thereof may be overlapped. In addition, the protective film 43 may be formed of any material with an insulation properties. For example, it is possible to preferably use alumina (aluminum oxide ($Al_2O_3$)) with a high melting point, and excellent electrical insulation in the protective film 43. In addition to this, it is possible to use polyimide, tantalum (Ta), hafnium (Hf), and a compound, or the like, including these in the protective film 43.

In addition, as illustrated in FIG. 5, a lower end portion of the sealing plate 20 is bonded to a region on the end portion on one side of the piezoelectric layer 28, and is a region from a midpoint of the common metal layer 30b to the end portion of the lead electrode unit 41 through the adhesive 37. That is, a region between the common metal layer 30b and the lead electrode unit 41 to which the protective film 43 is exposed is filled with the adhesive 37, and the lower end portion of the sealing plate 20 is bonded to a region which overlaps with the border position between the active unit and the non-active unit of the piezoelectric layer 28.

As illustrated in FIGS. 3 and 5, the lead electrode unit 41 is formed in a region which is the outside compared to the end portion on one side of the pressure chamber 22 in the longitudinal direction, and at a position which is separated from the higher electrode layer 29 with a predetermined interval. The end portion on the other side (piezoelectric element main body 19 side) of the lead electrode unit 41 according to the embodiment is stacked on the end portion on one side of the piezoelectric layer 28. That is, the individual higher electrode layer 39, an individual adhesion layer 45, and an individual metal layer 40 which are formed on the end portion on one side of the piezoelectric layer 28 with an interval with the higher electrode layer 29, the common adhesion layer 35b, and the common metal layer 30b are stacked in this order in each piezoelectric element main body 19 by corresponding to the lower electrode layer 27, respectively. In addition, end portions on the other side of the individual adhesion layer 45 and the individual metal layer 40 are extended to the piezoelectric element main body 19 side compared to the end portion on the other side of the individual higher electrode layer 39. The individual adhesion layer 45 and the individual metal layer 40 in a region separated from the end portion on the other side of the individual higher electrode layer 39 are stacked on the protective film 43. In addition, the individual higher electrode layer 39, the individual adhesion layer 45, and the individual metal layer 40 are electrically connected to the lower electrode layer 27 on the outside of the piezoelectric layer 28. The end portion on one side of the lead electrode unit 41 (side opposite to piezoelectric element main body 19) are extended to a terminal region (not illustrated), and are electrically connected to the individual electrode terminal of the wiring member.

In this manner, since the common metal layer 30 is formed in the border between the inside and the outside of the pressure chamber 22 (in detail, higher opening of pressure chamber space) in the longitudinal direction, it is possible for the common metal layer 30 to regulate a motion of the piezoelectric element main body 19 which is the active unit, and to prevent the end portion of the piezoelectric element main body 19 from being excessively deformed. In this manner, it is possible to weaken stress which occurs at the border position between the active unit and the non-active unit. In addition, since the piezoelectric layer 28 is extended to the outside of the pressure chamber 22 (in detail, higher opening of pressure chamber space) in the region of the piezoelectric element main body 19 on the extended side, and the protective film 43 is formed between the common adhesion layer 35b and the piezoelectric layer 28 in the region which is separated from the higher electrode layer 29, it is possible to weaken an electric field which is applied to the piezoelectric layer 28 at the portion on which the protective film 43 is stacked. In this manner, it is possible to suppress the deformation of the portion, and to prevent stress from being concentrated on the border position between the active unit and the non-active unit. In this manner, when the piezoelectric element main body 19 is deformed, it is possible to further reliably suppress a malfunction such as an occurrence of a cracking, or the like, in the piezoelectric layer 28. As a result, it is possible to improve the reliability of the piezoelectric element, and to improve the reliability of the recording head 3 and the printer 1.

Figure 6A:
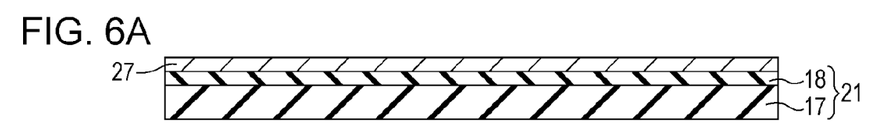
FIGS. 6A to 6F are process drawings which describe a manufacturing method of a piezoelectric element.
Figure 6B:
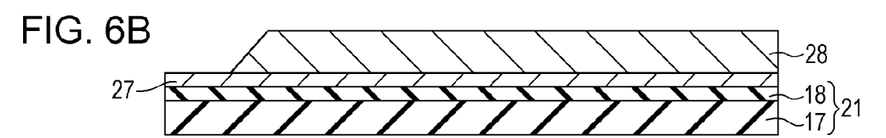
Figure 6C:
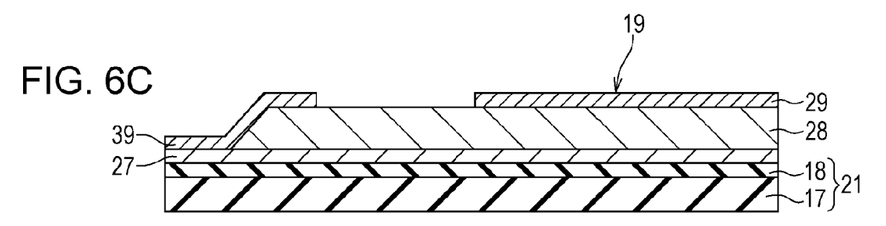

Subsequently, a manufacturing method of the above described piezoelectric element will be described. FIGS. 6A to 6F are process drawings which describe the manufacturing method of the piezoelectric element. First, as illustrated in FIG. 6A, a thin film which becomes the lower electrode layer 27 is manufactured on one face of the vibrating plate 21 which is formed of the elastic film 17 and the insulating film 18, and the lower electrode layer 27 is patterned using a photolithography technology. Specifically, a resist mask corresponding to a shape of the lower electrode layer 27 is formed on the thin film through an application process, an exposure process, and a developing process of a resist layer. Thereafter, the lower electrode layer 27 is formed by removing unnecessary portions of the thin film in an etching process, and removing the resist mask in a resist removing process. Subsequently, as illustrated in FIG. 6B, a thin film which becomes the piezoelectric layer 28 is manufactured on one face of the vibrating plate 21 on which the lower electrode layer 27 is formed, and the piezoelectric layer 28 is patterned using a photolithography technology. Subsequently, as illustrated in FIG. 6C, thin films which become the higher electrode layer 29 and the individual higher electrode layer 39 are manufactured on one face of the vibrating plate 21 on which the piezoelectric layer 28 is formed, and the higher electrode layer 29 and the individual higher electrode layer 39 are patterned using a photolithography technology. In this manner, the piezoelectric element main body 19 is formed.

Figure 6D:
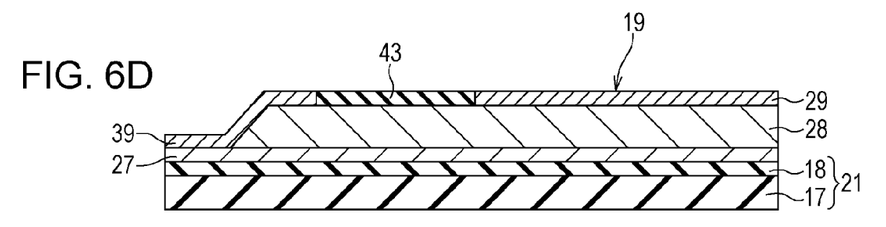

When the piezoelectric element main body 19 is formed, a thin film which becomes the protective film 43 is manufactured on one face of the vibrating plate 21 on which the piezoelectric element main body 19 is formed, and as illustrated in FIG. 6D, the protective film 43 is patterned using a photolithography technology. In this manner, the protective film 43 is formed between the higher electrode layer 29 and the individual higher electrode layer 39. In addition, at this time, a part of the protective film 43, and a part of the higher electrode layer 29 and a part of the individual higher electrode layer 39 may overlap with each other. In this case, a portion at which the protective film 43 and the higher electrode layer 29 are overlapped, or a portion at which the protective film 43 and the individual higher electrode layer 39 are overlapped may be left as they are; however it is also possible to remove only the protective film 43 of the overlapped portion using etching. In addition, it is also possible to make the thickness of the protective film 43 the same as the thickness of the higher electrode layer 29 and the individual higher electrode layer 39 by adjusting the thickness of the protective film using etching.

Figure 6E:
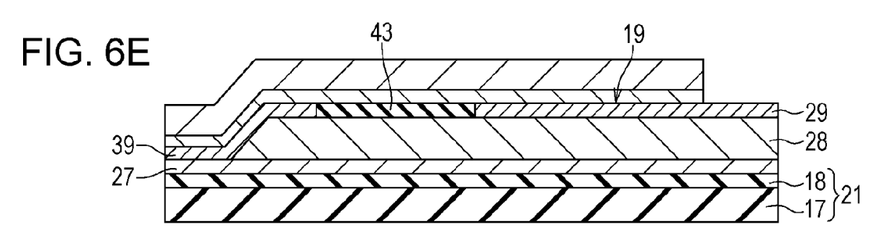
Figure 6F:
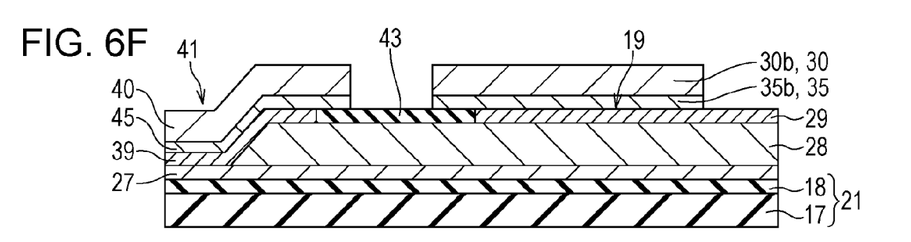

Subsequently, as illustrated in FIG. 6E, thin films which become the common adhesion layer 35 and the individual common adhesion layer 45 are manufactured on one face of the vibrating plate 21 on which the protective film 43 is formed, and thin films which become the common metal layer 30 and the individual metal layer 40 are manufactured thereon. Finally, as illustrated in FIG. 6F, both thin films are patterned into shapes of the common metal layer 30 and the individual metal layer 40 using a photolithography technology. In this manner, the common adhesion layer 35b and the common metal layer 30b are stacked from the end portion on one side of the higher electrode layer 29 to the end portion on the other side of the protective film 43, and the individual common adhesion layer 45 and the individual metal layer 40 are stacked in the lead electrode unit 41. In addition, the manufacturing method of the piezoelectric element is not limited to the above described method, and any method may be used when it is possible to form the protective film 43 between the common adhesion layer 35b and the piezoelectric layer 28 in a region which is separated from the end portion on one side of the higher electrode layer 29.

Meanwhile, according to the embodiment, the protective film 43 is formed between the end portion on one side of the common adhesion layer 35b on one side and the piezoelectric layer 28; however, the invention is not limited to this. For example, the invention may have a configuration in which the end portion of the common adhesion layer on the other side is extended to the outside (side opposite to pressure chamber) beyond the end portion on the other side of the higher electrode layer, and the protective film is formed between the common adhesion layer and the piezoelectric layer in a region which is separated from the end portion on the other side of the higher electrode layer. In addition, according to the embodiment, the shape of the pressure chamber 22 (pressure chamber space) is formed in a trapezoidal shape in a planar view; however, the shape is not limited to this. For example, it is possible to adopt various shapes such as a parallelogrammic shape, or a rectangular shape. In addition, according to the embodiment, the inner wall which partitions the pressure chamber space in the longitudinal direction is a slope which is inclined to a vertical plane of the pressure chamber forming substrate 15; however, the invention is not limited to this. For example, the invention may have a configuration in which the inner wall which partitions the pressure chamber space is orthogonal to the vertical plane of the pressure chamber forming substrate. In addition, according to the embodiment, the opening portion 28a of the piezoelectric layer 28 forms a hexagonal shape in a planar view; however, the shape is not limited to this. For example, it is possible to adopt various shapes such as a parallelogrammic shape, or a rectangular shape.

In the above described embodiment, an ink jet recording head which is mounted on an ink jet printer is exemplified; however, it is also possible to be applied to a recording head which ejects liquid other than ink when it is a recording head which includes the piezoelectric element with the above described configuration. For example, it is also possible to apply the invention to a coloring material ejecting head which is used when manufacturing a color filter of a liquid crystal display, or the like, an electrode material ejecting head which is used when forming an electrode of an organic electro luminescence (EL) display, FED (surface light emitting display), or the like, a bioorganic material ejecting head which is used when manufacturing a biochip (biochemical element), or the like.

In addition, the invention can also be applied to a piezoelectric element which is used in various sensors, for example, and is not only used as an actuator in a liquid ejecting head or a liquid ejecting apparatus.

What is claimed is:

1. A piezoelectric element comprising:
    a support body which is formed of a first region in which a flexural deformation is allowed, and a second region which is an outside of the first region, and in which the flexural deformation is inhibited;
    a piezoelectric element main body which is formed by staking a first electrode layer, a piezoelectric layer, and a second electrode layer on the first region of the support body in this order; and
    a metal layer which is stacked on the second electrode layer through an adhesion layer,
    wherein a part of the piezoelectric element main body is extended to the second region, and an end portion of the piezoelectric layer is extended to an outside of an end portion of the second electrode layer in a region on the extended side,
    wherein the metal layer and the adhesion layer are extended to the second region beyond the end portion of the second electrode layer from a position of being overlapped with the first region in the region on the extended side, and
    wherein a protective film with insulation properties is formed between and directly contacts the adhesion layer and the piezoelectric layer in a region where the second electrode layer is not formed.

2. A liquid ejecting head comprising:
    the piezoelectric element according to claim 1.

3. A liquid ejecting apparatus comprising:
    the liquid ejecting head according to claim 2.

* * * * *